(12) United States Patent
Tachibana et al.

(10) Patent No.: US 6,870,088 B2
(45) Date of Patent: Mar. 22, 2005

(54) SOLAR BATTERY CELL AND MANUFACTURING METHOD THEREOF

(75) Inventors: Shinsuke Tachibana, Kashiba (JP); Hitoshi Sannomiya, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/385,567

(22) Filed: Mar. 12, 2003

(65) Prior Publication Data

US 2003/0172967 A1 Sep. 18, 2003

(30) Foreign Application Priority Data

Mar. 15, 2002 (JP) ....................... 2002-072593

(51) Int. Cl.⁷ ................ H01L 31/05; H01L 31/042
(52) U.S. Cl. ............. 136/249; 136/244; 136/255; 136/258; 136/261; 257/458; 257/459; 257/443
(58) Field of Search ................ 136/244, 249, 136/255, 258, 261; 257/458, 459, 443

(56) References Cited

U.S. PATENT DOCUMENTS

| | | | | |
|---|---|---|---|---|
| 4,316,049 A | * | 2/1982 | Hanak | 136/244 |
| 4,914,044 A | * | 4/1990 | Grabmaier et al. | 438/65 |
| 4,948,436 A | * | 8/1990 | Juergens | 136/249 |
| 5,021,099 A | * | 6/1991 | Kim et al. | 136/249 |
| 5,853,497 A | * | 12/1998 | Lillington et al. | 136/249 |
| 6,566,159 B2 | * | 5/2003 | Sawada et al. | 438/57 |
| 2003/0160251 A1 | * | 8/2003 | Wanlass et al. | 257/80 |

FOREIGN PATENT DOCUMENTS

| | | | |
|---|---|---|---|
| JP | 63-122283 A | * | 5/1988 |
| JP | 9-129903 | | 5/1997 |
| JP | 9-129906 | | 5/1997 |
| JP | 2001-217435 A | * | 8/2001 |
| JP | 2002-314104 A | * | 10/2002 |
| JP | 2002-343998 A | * | 11/2002 |

* cited by examiner

*Primary Examiner*—Alan Diamond
(74) *Attorney, Agent, or Firm*—Nixon & Vanderhye P.C.

(57) ABSTRACT

A solar battery cell of a serial stacked structure, increasing scattering of light, exhibiting good power-generating efficiency per unit area, and ensuring high reliability and a large yield in the manufacturing process, is provided. The solar battery cell includes a plurality of power-generating regions connected in series, each having insulative transparent semiconductor, front electrode, intermediate transparent conductive film, photoelectric conversion layer formed of stacked semiconductor films, and back electrode, and a contact line electrically connecting the front electrode and the back electrode of the neighboring respective power-generating regions. One power-generating region has at least two photoelectric conversion layers with the intermediate transparent conductive films sandwiched therebetween. At least one member of nonconductor and/or semiconductor is provided between the intermediate transparent conductive film and the contact line to prevent direct contact thereof.

7 Claims, 8 Drawing Sheets

▨ OUTPUT DISTRIBUTION OF SOLAR BATTERY CELL HAVING THE INTEGRATED STRUCTURE OF THE INVENTION
☱ OUTPUT DISTRIBUTION OF SOLAR BATTERY CELL HAVING THE INTEGRATED STRUCTURE OF COMPARATIVE EXAMPLE

SOLAR BATTERY CELL AND MANUFACTURING METHOD THEREOF

BACKGROUND OF THE INVENTION

1. Field of the Invention

The present invention relates to a solar battery cell. More particularly, the present invention relates to a solar battery cell having a plurality of power-generating regions connected in series, each power-generating region having an insulative transparent substrate, a front electrode, an intermediate transparent conductive film, a photoelectric conversion layer formed of stacked semiconductor films, and a back electrode.

Further, the present invention relates to a manufacturing method of the solar battery cell as described above. More particularly, the present invention relates to a manufacturing method of the solar battery cell having a plurality of power-generating regions connected in series, each power-generating region having an insulative transparent substrate, a front electrode, an intermediate transparent conductive film, a photoelectric conversion layer formed of stacked semiconductor films, and a back electrode.

2. Description of the Background Art

A photovoltaic power generating system using solar battery cells to directly generate electric energy from sunbeam has recently undergone rapid technical development to the extent permitting practical use. Now, the photovoltaic power generating system is considered a promising clean energy technique which can protect the global environment of the 21st century from environmental contamination due to combustion of fossil fuels.

Here, materials for solar battery cells used in the solar battery are largely classified into the following four groups:
(i) IV group semiconductors;
(ii) compound semiconductors (III–V group, II–VI group, I–III–VI group);
(iii) organic semiconductors; and
(iv) compounds, such as $TiO_2$, used for wet type photovoltaic power generation.

Among them, practical utilization of the IV group semiconductors has proceeded most vigorously because of their lower manufacturing cost compared to the other materials. The IV group semiconductors are largely divided into (i) crystalline based semiconductors and (ii) non-crystalline semiconductors (also called amorphous semiconductors).

Materials of the crystalline based semiconductors used for the solar battery cells include monocrystal silicon, monocrystal germanium, polycrystal silicon, and microcrystal silicon.

The non-crystalline semiconductors used for the solar battery cells include amorphous silicon.

Here, the solar battery cells made of such semiconductor materials are largely classified into the following three types:
(i) pn junction type;
(ii) pin junction type; and
(iii) hetero junction type.

Among them, the pn junction type is often used in a solar battery cell employing a crystalline based semiconductor in which the carrier diffusion distance is great. By comparison, in a solar battery cell employing a non-crystalline semiconductor in which the carrier diffusion distance is small and local levels exist, the pin junction type is often used, since it is advantageous to make the carriers move by drift with an internal electric field in the i (intrinsic) layer.

Generally, a solar battery cell of the pin junction type has a typical structure where a transparent conductive film of $SnO_2$, ITO, ZnO or the like is formed on an insulative transparent substrate of glass or the like, a photoelectric conversion layer is formed with p layer, i layer and n layer of non-crystalline semiconductors stacked thereon in this order, and a back electrode of metal thin film or the like is stacked further thereon. There also is a solar battery cell of the pin junction type having a reversed structure where a photoelectric conversion layer is formed with n layer, i layer and p layer of non-crystalline semiconductors stacked in this order on a back electrode of metal thin film or the like, and a transparent conductive film is stacked thereon.

Currently, the method of stacking p-i-n layers in this order has become dominant, because of the reasons that the transparent insulative substrate can also serve as a surface cover glass of the solar battery cell, and that, with development of a plasma-resistant transparent conductive film such as $SnO_2$, it has become possible to use plasma CVD to form the photoelectric conversion layer of non-crystalline semiconductors thereon.

Here, the energy conversion efficiency of the solar battery manufactured with the above-described solar battery cells is represented in % as a ratio between solar radiation light energy being input and electric energy being output from a terminal of the solar battery.

That is, the conversion efficiency η is defined as follows.
η=(electric output of the solar battery)/(solar energy input to the solar battery)×100%

To standardize criteria for measurement of the conversion efficiency, the International Electrotechnical Commission has defined a nominal efficiency as a ratio, in percentage, of the maximal electric output with respect to the input light power of 100 $mW/cm^2$ when the load condition is changed, with an air mass condition of the solar radiation being AM 1.5.

Nominal efficiency $η_n$ of a solar battery can be derived from maximal output point voltage $V_{max}$, maximal output point current $I_{max}$, open voltage $V_{oc}$ and short-circuited photoelectric current density $I_{sc}$ that are obtained from measurement of an output of the solar battery based on the above-described conditions.

Namely, when the input light power of the sunbeam is represented as $P_{in}$ and the effective light-receptive area of the solar battery is represented as S ($cm^2$), nominal efficiency $η_n$ can be expressed as follows:

$$η_n = (V_{max} \cdot I_{max})/(P_{in} \cdot S) \times 100\%$$
$$= (V_{oc} \cdot I_{sc} \cdot FF)/100(mW \cdot cm^{-2}) \times 100\%$$
$$= V_{oc}(V) \cdot I_{sc}(mA \cdot cm^{-2}) FF\ (\%)$$
where $FF = (V_{max} \cdot I_{max})/(V_{oc} \cdot I_{sc})$.

The FF represents a fill factor, which constitutes an important index to performance of the solar battery.

As seen from the above expression, in the measurement with the input power regulated to 100 $mW \cdot cm^{-2}$, if $V_{oc}$ and $I_{sc}$ and hence FF are found through the experiment, a product thereof can be calculated to obtain the nominal efficiency of the solar battery.

The nominal efficiency of the solar battery obtained in this manner is generally from about 10% to about 20%. In other words, from about 80% to about 90% of the solar energy is not converted to electric energy but dissipated somewhere, possibly due to the following reasons.

(i) Cell surface reflects sunlight.

For example, a silicon solar battery has a silicon plate surface like a dark mirror, since the cell surface reflects the light. The cell surface is normally coated with an anti-reflection film to reduce such reflection.

(ii) It is impossible to absorb the sunlight entirely in full wavelengths.

The sunbeam mostly has the wavelengths of 0.2–3 μm (ultraviolet light, visible light, infrared light), which cannot be absorbed entirely. Which wavelength is more efficiently converted to electric energy depends on how and of which material the solar battery is made.

(iii) Free electrons and free holes are not generated 100%.

The free electrons and free holes may not be generated upon irradiation of light. Even though generated, they have certain lifetimes and may be lost at once, before being taken out as electric energy.

(iv) Yield of free electrons and free holes is not 100%.

A certain amount of the free electrons and free holes generated at and separated from a pn junction surface or the like are lost during migration toward the electrodes.

(v) Solar battery has resistance therein.

Since the silicon material, electrode portion and others have electric resistances, electricity generated cannot be completely taken to the outside, leading to reduction of FF.

Based on the foregoing, eliminating or alleviating these causes will lead to further improvement of the nominal efficiency of the currently available solar battery.

In addition to such efforts, it has also been attempted to improve the nominal efficiency of the solar battery by increasing the degree of integration thereof, specifically by providing a larger number of photoelectric conversion layers on the substrate of the solar battery.

For example, in a solar battery cell called a multiple junction type, a large number of photoelectric conversion layers are stacked one another in a travelling direction of light, such that the respective photoelectric conversion layers absorb the light sequentially from the short-wavelength side, to generate voltages corresponding to their respective bandgaps Eg.

It is often the case that such a structure is employed together with a method for improving the conversion efficiency of the solar battery, where a material of high reflectivity, such as Ag, Al or the like, is used for the back electrode of the solar battery cell to increase the light absorbing efficiency in the photoelectric conversion layer, and a transparent electrode is inserted between the photoelectric conversion layer and the back electrode to scatter light, thereby increasing the optical path length of the incident light in the photoelectric conversion layer. In this case, a material containing $SnO_2$, ZnO, ITO or the like is often used for the transparent electrode.

In recent years, a solar battery cell having a power-generating region where two or three layers of photoelectric conversion layers are stacked one another for the purpose of further increasing the voltage generated in one power-generating region, has been developed vigorously. Also under development is a solar battery cell having a multi-bandgap type power-generating region where an upper photoelectric conversion layer and a lower photoelectric conversion layer have different bandgaps from each other to effectively utilize the energy of different wavelengths of the sunbeam.

In general, in the case where electronic equipment is driven by a solar battery or the solar battery is used for power supply, it is necessary to employ a solar battery cell of a large area having a plurality of power-generating regions connected in series, since the voltage generated in one power-generating region is not more than 1 V.

For example, a common solar battery cell is formed on an insulative substrate using a patterning process or the like. In this case, a plurality of power-generating regions, each having a transparent electrode, a photoelectric conversion layer and a back electrode, are formed on a transparent insulative substrate such as a single glass substrate, and the neighboring power-generating regions are connected in series.

In the patterning process of the solar battery cell described above, the patterning has conventionally been performed by etching using a resin mask or the like. With this method, however, a large number of processes are required for formation of the stacked structure. In addition, it can handle only the substrates of a limited dimensional range, and the effective area of the power-generating regions within the substrate of the solar battery would be small. Pinholes would be generated in the photoelectric conversion layer with such a wet process, and patterning would be difficult in the case of a substrate having a curved surface.

On the other hand, patterning utilizing heating by laser irradiation has recently been developed and come into wide use. This patterning utilizing laser can reduce the number of processes for forming the stacked structure. It also makes it possible to form a solar battery cell on a substrate of large area, or even on a substrate of an arbitrary structure such as one having a curved surface. The effective area of the power-generating regions within the substrate of the solar battery also increases. This patterning is suitable for continuous production and automated production.

In particular, while the conventional patterning by etching using a resin mask or the like would require a distance of about 3 mm between the neighboring power-generating regions, the patterning utilizing heating by laser irradiation can reduce it to not more than 0.5 mm. Accordingly, adopting such patterning utilizing heating by laser irradiation can increase the effective area of the power-generating regions within the substrate of the solar battery, and improve the output of the solar battery cell per unit area by not less than 30%.

In the solar battery cell having a power-generating region in which photoelectric conversion layers are stacked as described above (herein, also referred to as the "stacked type solar battery cell"), when the power-generating region has a two-layer structure of an upper photoelectric conversion layer (herein, also referred to as the "upper cell") and a lower photoelectric conversion layer (herein, also referred to as the "lower cell"), the power-generating efficiency of the relevant stacked type solar battery cell usually becomes maximum when the current values of the upper cell and the lower cell are equal to each other.

Here, assume that photovoltaic power generation is conducted using a solar battery cell provided with a power-generating region having a stacked body of amorphous silicon thin films as an upper cell and a stacked body of microcrystal silicon thin films as a lower cell. In this case, it is conceivable, for the purpose of improving the power-generating efficiency of the solar battery cell, to increase the film thickness of the upper cell and hence the current value being generated therein, so as to balance the current values in the upper and lower cells.

When the film thickness of the upper cell of the solar battery cell is increased, however, although the current values generated in the upper and lower cells may be balanced, such an increased film thickness of the upper cell would cause further degradation of light, thereby adversely decreasing the power-generating efficiency of the solar battery cell.

A conceivable way to overcome the above-described problem is to insert a transparent conductive film (herein, also referred to as the "intermediate transparent conductive film"), having a refractive index of light different from those of the upper and lower cells, between the upper cell and the lower cell of the solar battery cell. Reflecting light with the intermediate transparent conductive film will allow even a thin upper cell to generate a high current value.

Here, such a stacked type solar battery cell will be able to generate a sufficient amount of voltage only if it has a stacked structure (herein, also referred to as the "serial stacked structure") where a plurality of power-generating regions, each having stacked photoelectric conversion layers, are connected in series. In the case of a stacked type solar battery cell having a transparent conductive film interposed between upper and lower cells, however, forming such a serial stacked structure by conventionally known patterning utilizing heating by laser irradiation (herein, also referred to as "laser patterning"), for example, would cause short circuit in the upper cell, leading to degradation of the output of the stacked type solar battery cell.

In other words, in order to form a serial stacked structure in a solar battery cell, it is necessary to connect a back electrode and a front electrode in the neighboring power-generating regions with a contact line filled with a conductive material so as to connect the power-generating regions in series. With the solar battery cell having the intermediate transparent conductive film formed between the upper and lower cells, if such a contact line is formed by a conventional method like laser patterning, it is highly possible that the contact line will directly contact the intermediate transparent conductive film.

For example, FIG. 5 shows a structure obtained when a serial stacked type solar battery having power-generating regions of a two-layer structure of upper and lower cells is formed with a common serial stacked structure as in the one unprovided with an intermediate transparent conductive film 1. In this serial stacked structure, however, the intermediate transparent conductive film 1 is formed between an upper cell 2 and a lower cell 3. As such, when a contact line open groove 9 for electrically connecting a back electrode 6 and a front electrode 5 is formed to connect the neighboring power-generating regions, intermediate transparent conductive film 1 and contact line open groove 9 will directly contact with each other. This renders upper cell 2 short-circuited, thereby posing a problem that the output of the relevant serial stacked type solar battery cell becomes less than half the intended amount.

Currently, strenuous efforts for research and development have been made in a variety of fields to solve the above-described problem. For example, Japanese Patent Laying-Open No. 9-129903 discloses a serial stacked structure as shown in FIG. 6. This serial stacked structure, however, has the following disadvantages. Assume that the front electrode 5, the upper cell 2 and the intermediate transparent conductive film 1 are being subjected to laser patterning at the same time. In this case, if processing of front electrode 5 is insufficient, although front electrodes 5 in the neighboring power-generating regions may be separated from each other, sublimated front electrode 5 would be redeposited on the side surfaces of upper cells 2. This may cause short circuit between intermediate transparent conductive film 1 and front electrode 5 even if ultrasonic cleaning or the like is conducted, thereby degrading the output of the solar battery cell. This leads to reduction of the manufacturing yield of the solar battery cells.

Further, in the solar battery cell having the serial stacked structure as shown in FIG. 6, when lower cell 3 is being formed by CVD using a material containing microcrystal silicon, lower cell 3 is required to have a film thickness of not less than 2 µm. In addition, since there is a site where lower cell 3 and insulative transparent substrate 4 directly contact with each other, peeling of lower cell 3 is very likely to occur during formation of lower cell 3, depending on the deposition condition thereof. This leads to deterioration of reliability, reduction of the manufacturing yield of the solar battery cells, and restricted improvement in efficiency of the cells.

In general, laser scribing of front electrodes 5 is followed by measurement of separation resistance between the cells. If the separation is insufficient, the succeeding step is prevented from starting or a portion failed in processing is repaired so as to effectively use the material or improve an average output. Such confirmation and repair, however, are impossible during the processes of the structure shown in FIG. 6.

Further, Japanese Patent Laying-Open No. 9-129906 discloses a serial stacked structure as shown in FIG. 7. In a solar battery cell having the serial stacked structure of FIG. 7, again, the lower cell 3 needs to have a thickness of not less than 2 µm when it is formed by CVD using a material containing microcrystal silicon. In addition, there is a site where lower cell 3 and insulative transparent substrate 4 directly contact with each other. Accordingly, it is very likely that lower cell 3 is peeled off during its formation, depending on the deposition condition thereof. This results in poor reliability and a decreased manufacturing yield-of the solar battery cells, thereby hindering improvement in efficiency of the cells.

As described above, in forming a solar battery cell having a serial stacked structure with an intermediate transparent conductive film formed between the upper and lower cells, a specific structure needs to be adopted to prevent short circuit between the back electrode and the intermediate transparent conductive film. To date, any structure conventionally known has not solved the problems of deterioration in reliability of the solar battery cell and a decrease of the manufacturing yield of the solar battery cells.

SUMMARY OF THE INVENTION

In view of the current situations as described above, an object of the present invention is to provide a solar battery cell having a serial stacked structure which exhibits an excellent effect of increasing scattering of light, is excellent in power-generating efficiency per unit area, and ensures high reliability and a good yield in the manufacturing process thereof.

Another object of the present invention is to provide a highly reliable and highly yielding manufacturing method of a solar battery cell having a serial stacked structure which exhibits an excellent effect of increasing scattering of light and is excellent in power-generating efficiency per unit area.

To achieve the above objects, the inventors came to an idea to insert an intermediate transparent conductive film between a plurality of photoelectric conversion layers and, at the same time, to prevent the intermediate transparent conductive film from directly contacting a contact line. The inventors thoroughly studied, through experiments of a variety of combinations of manufacturing processes for a variety of novel serial stacked structures, to find a structure and a manufacturing method of a solar battery cell with which the relevant serial stacked structure can be formed with high reliability and a good yield.

The inventors have finally found that a serial stacked type solar battery cell having one or more members of nonconductor and/or semiconductor provided between an intermediate transparent conductive film and a contact line to prevent direct contact of the intermediate transparent conductive film with the contact line, exhibits an excellent effect of increasing scattering of light, is excellent in power-generating efficiency per unit area, and ensures high reliability and a large yield in its manufacturing process.

Further, the inventors have found that changing a maximal diameter of a beam cross section on a processing surface can realize higher reliability and a larger yield in the manufacturing process of the solar battery cell having the structure as described above. The present invention has thus been completed.

In summary, the solar battery cell of the present invention includes a plurality of power-generating regions connected in series, each power-generating region having an insulative transparent substrate, a front electrode, an intermediate transparent conductive film, a photoelectric conversion layer formed of stacked semiconductor films, and a back electrode, and the solar battery cell further includes a contact line electrically connecting the front electrode and the back electrode in the respective neighboring power-generating regions. It is characterized in that each power-generating region has at least two photoelectric conversion layers with the intermediate transparent conductive film sandwiched therebetween, and that at least one member formed of nonconductor and/or semiconductor is provided between the intermediate transparent conductive film and the contact line to prevent direct contact between the intermediate transparent conductive film and the contact line.

Here, in the solar battery cell of the present invention, one power-generating region preferably has two photoelectric conversion layers stacked one another with the intermediate transparent conductive film sandwiched therebetween.

Further, in the solar battery cell of the present invention, the at least one member of non-conductor and/or semiconductor provided between the intermediate transparent conductive film and the contact line is preferably made of a material having the same composition with a portion of the photoelectric conversion layer that is provided on the back surface side of the intermediate transparent conductive film.

Still further, in the solar battery cell of the present invention, the at least one member of non-conductor and/or semiconductor provided between the intermediate transparent conductive film and the contact line is preferably made of a semiconductor having the same composition with the semiconductor film included in the photoelectric conversion layer that is provided on the back surface side of the intermediate transparent conductive film and that is provided within the photoelectric conversion layer closest to the light incident side.

In the solar battery cell of the present invention, the at least one member of non-conductor and/or semiconductor provided between the intermediate transparent conductive film and the contact line may be a composite member including a site that is made of a material having the same composition with a portion of the photoelectric conversion layer that is provided on the light incident side of the intermediate transparent conductive film and a site that is made of a material having the same composition with a portion of the photoelectric conversion layer that is provided on the back surface side of the intermediate transparent conductive film.

Further, in the solar battery cell of the present invention, the at least one member of non-conductor and/or semiconductor provided between the intermediate transparent conductive film and the contact line may be a composite member including a site that is made of at least one semiconductor having the same composition with at least one semiconductor film that is included in the photoelectric conversion layer provided on the light incident side of the intermediate transparent conductive film, and a site that is made of a semiconductor having the same composition with a semiconductor film that is included in the photoelectric conversion layer provided on the back surface side of the intermediate transparent conductive film and that is provide within the photoelectric conversion layer closest to the light incident side.

Here, in the solar battery cell of the present invention, the semiconductor film constituting the photoelectric conversion layer is preferably a crystalline silicon based semiconductor film or a non-crystalline silicon based semiconductor film. Further, in the solar battery cell of the present invention, the front electrode is preferably made of a transparent conductive film using a material containing zinc oxide, tin oxide or ITO.

Still further, in the solar battery cell of the present invention, the photoelectric conversion layers formed of stacked semiconductor films preferably have a p-i-n type three-layer structure of a—Si:H and/or a p-i-n type three-layer structure of $\mu$c—Si:H. In the solar battery cell of the present invention, the back electrode preferably has a stacked structure of a transparent conductive film using a material containing zinc oxide, tin oxide or ITO, and a metal film using a material containing Ag or Al.

In the solar battery cell of the present invention, the contact line is preferably made of a member using a material having the same composition with a portion of the back electrode. In the solar battery cell of the present invention, the intermediate transparent conductive film is preferably formed of a transparent conductive film having a material containing zinc oxide, tin oxide or ITO.

The present invention also provides a manufacturing method of the solar battery cell described above. The method includes an A step of forming a photoelectric conversion layer and forming an intermediate transparent conductive film on a back surface side of the photoelectric conversion layer in contact therewith, a B step of forming an intermediate transparent conductive film separating line that penetrates the intermediate transparent conductive film and a member sandwiched between the intermediate transparent conductive film and a front electrode to reach a back side surface of the front electrode, a C step of forming another photoelectric conversion layer on the back surface side of the intermediate transparent conductive film and in the intermediate transparent conductive film separating line to contact the intermediate transparent conductive film and an outer hull of the intermediate transparent conductive film separating line, and a D step of forming a contact line open groove that penetrates a member sandwiched between a back electrode and the surface electrode to reach a back side surface of the front electrode. A cross section of the intermediate transparent conductive film separating line by a flat or curved plane in parallel with the transparent insulative substrate, encloses a cross section of the contact line open groove by the same flat or curved plane.

The present invention further provides another manufacturing method of the solar battery cell described above. The method includes an A step of forming a photoelectric conversion layer and forming an intermediate transparent conductive film on a back surface side of the photoelectric conversion layer in contact therewith, a B step of forming an intermediate transparent conductive film separating line that penetrates the intermediate transparent conductive film and partially removes the photoelectric conversion layer, a C step of forming another photoelectric conversion layer on a back surface side of the intermediate transparent conductive film and in the intermediate transparent conductive film separating line to contact the intermediate transparent conductive film and an outer hull of the intermediate transparent conductive film separating line, and a D step of forming a contact line open groove that penetrates a member sandwiched between a back electrode and the front electrode to reach a back side surface of the front electrode. A cross section of the intermediate transparent conductive film separating line by a flat or curved plane in parallel with a transparent insulative substrate encloses a cross section of the contact line open groove by the same flat or curved plane.

In the manufacturing method of the solar battery cell of the present invention, the intermediate transparent conductive film separating line and the contact line open groove are preferably formed by laser irradiation.

Further, in the manufacturing method of the solar battery cell of the present invention, the laser used in the D step has a maximal diameter of a beam cross section that is smaller than that of the laser used in the B step.

Still further, in the manufacturing method of the solar battery cell of the present invention, the intermediate transparent conductive film is preferably formed by sputtering, and the photoelectric conversion layer is preferably formed by plasma CVD.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
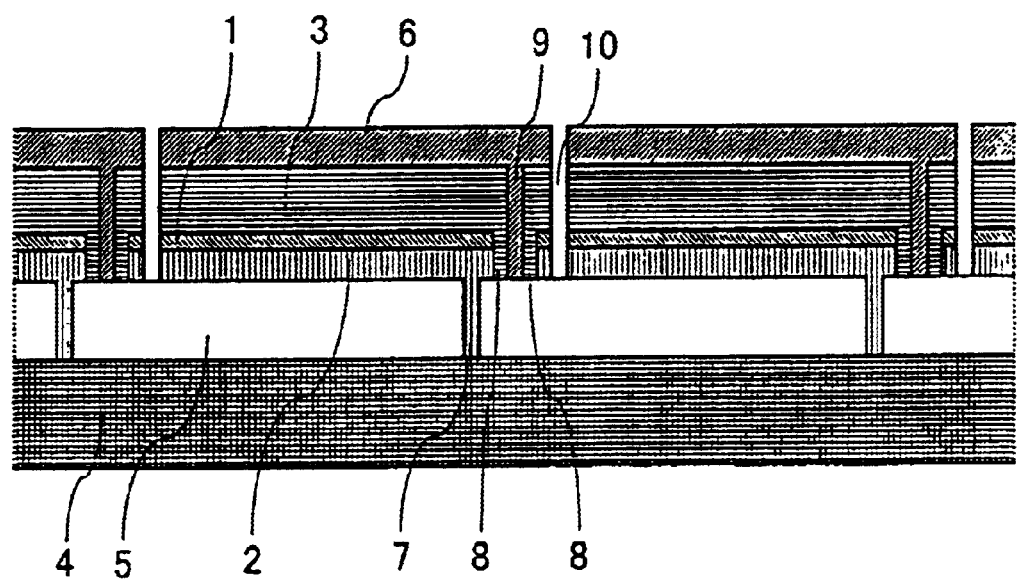
FIG. 1 is a schematic cross sectional view of a solar battery cell made in Example 1 of the present invention.

Hereinafter, embodiments of the present invention will be described in detail with reference to the drawings.

Structure of Solar Battery Cell

The solar battery cell of the present invention includes a plurality of power-generating regions connected in series, each having an insulative transparent substrate, a front electrode, an intermediate transparent conductive film, a photoelectric conversion layer formed of stacked semiconductor films, and a back electrode, and also includes a plurality of contact lines each electrically connecting the front electrode and the back electrode in the neighboring power-generating regions. Each power-generating region has at least two photoelectric conversion layers stacked one another with the intermediate transparent conductive film sandwiched therebetween, and at least one member formed of nonconductor and/or semiconductor is provided between the intermediate transparent conductive film and the contact line to prevent direct contact therebetween.

Insulative Transparent Substrate

The insulative transparent substrate for use in the solar battery cell of the present invention may be any substrate commonly used for a solar battery cell, as long as it is insulative and transparent. Specific examples of the insulative transparent substrate used in the present invention include those made of glass, quartz, and transparent plastic.

It is unnecessary for the insulative transparent substrate used in the present invention to be insulative in every site. It will suffice if at least an electrode forming surface is insulated. That is, even a conductive substrate can be used as the insulative transparent substrate in the present invention if its electrode forming surface is covered with an insulator.

Front Electrode

The front electrode for use in the solar battery cell of the present invention is formed on the transparent substrate. Here, as the front electrode of the present invention, any front electrode commonly used for a solar battery cell can be used, as long as it is conductive and transparent. A film electrode made of a transparent and conductive material (herein, also referred to as the "transparent conductive film") is preferably used as the front electrode in the present invention.

It is unnecessary for the front electrode used in the present invention to be transparent in every site. It will suffice if at least some site is transparent to let light transmit therethrough in an amount required for photovoltaic power generation. That is, even an electrode made of a nontransparent material like metal can be used as the front electrode in the present invention, if it has a grid structure, for example, letting light transmit therethrough.

Specific examples of the front electrode used in the present invention include transparent conductive films made of tin oxide, zinc oxide, ITO and others. Here, tin oxide includes not only $SnO_2$ but also those of various compositions represented as $Sn_mO_n$ (m and n are positive integers). Similarly, zinc oxide includes not only ZnO but also those of various compositions represented as $Zn_{m'}O_{n'}$ (m' and n' are positive integers). ITO is an abbreviation of Indium Tin Oxide.

Although ITO and $SnO_2$ are hardly different in transparency, it is generally considered that ITO is superior in terms of low specific resistance and $SnO_2$ is superior in chemical stability. ZnO is advantageous in that its material cost is low compared to ITO. Further, while $SnO_2$ suffers surface reduction by plasma during formation of a-Si film, ZnO is highly resistant to plasma. ZnO also exhibits advantageously high transmittance with respect to long-wavelength light.

Further, in the case where the front electrode used in the present invention is a transparent conductive film made of a material containing ZnO, it may be doped with impurity such as Al, Ga or the like to lower the resistance thereof.

Among them, Ga superior in ability to lower resistance is preferably used as the dopant.

Still further, in the case where the front electrode used in the present invention is a transparent conductive film, it is preferable to provide irregularity to the surface thereof. Fine irregularity thus provided to the surface of the front transparent conductive film can scatter light within the power-generating region of the solar battery cell, resulting in an elongated optical path length. Accordingly, the power-generating efficiency of the solar battery cell is improved compared to the case where the front transparent conductive film has a flat or even surface.

Photoelectric Conversion Layer

The photoelectric conversion layer used in the solar battery cell of the present invention may be any photoelectric conversion layer commonly used for a solar battery cell, as long as it has a stacked structure of semiconductor films and is capable of photoelectric conversion.

Here, as a material of the photoelectric conversion layer of the present invention, any semiconductor material commonly used for a photoelectric conversion layer of a solar battery cell may be used. Specific examples include Si, Ge, SiGe, SiC, SiN, GaAs, and SiSn. Among them, silicon based semiconductors of Si, SiGe, SiC and others are used preferably.

The semiconductor as a material of the photoelectric conversion layer used in the present invention may be crystalline semiconductor of, e.g., microcrystal or polycrystal type, or non-crystalline semiconductor of, e.g., amorphous type. Here, as the non-crystalline semiconductor and the polycrystal based semiconductor, hydrogenated semiconductor is preferably employed which has a chemical structure where a dangling bond otherwise causing a local level is ended with hydrogen.

Further, the semiconductor films of the photoelectric conversion layer used in the present invention have a three-layer structure of p type, i type and n type. Here, the p type and n type semiconductors can be formed by introducing prescribed impurities therein. The three-layer structure is preferably a p-i-n structure having the p, i and n layers stacked in this order from the light incident surface side.

As the photoelectric conversion layer used in the solar battery cell of the present invention, the photoelectric conversion layer having a p-i-n type three-layer structure of hydrogenated amorphous silicon based semiconductor (a-Si:H) is particularly preferable.

Also particularly preferable is the photoelectric conversion layer having a p-i-n type three-layer structure of hydrogenated polycrystalline silicon based semiconductor ($\mu$c-Si:H).

Still further, the power-generating region provided in the solar battery cell of the present invention has at least two photoelectric conversion layers stacked one another. Here, the power-generating region provided in the solar battery cell of the present invention may have a so-called tandem structure having two photoelectric conversion layers stacked one another with an intermediate transparent conductive film interposed therebetween, or a structure having at least three photoelectric conversion layers stacked one another with the intermediate transparent conductive films interposed therebetween. The stacked two or more photoelectric conversion layers may be those of identical structures and materials or those of different structures and materials.

Here, the power-generating region provided in the solar battery cell of the present invention preferably has a stacked structure of two photoelectric conversion layers with an intermediate transparent conductive film interposed therebetween. In the solar battery cell having such a structure, an upper photoelectric conversion layer (herein, also referred to as the "upper cell") provided in contact with the intermediate transparent conductive film on the light incident surface side thereof, preferably has a p-i-n type three-layer structure of a-Si:H.

Further, in the solar battery cell having such a structure, a lower photoelectric conversion layer (herein, also referred to as the "lower cell") provided in contact with the intermediate transparent conductive film on the opposite side from the light incident surface side thereof, preferably has a p-i-n type three-layer structure of $\mu$c-Si:H.

Intermediate Transparent Conductive Film

The intermediate transparent conductive film for use in the present invention is formed between the stacked two or more photoelectric conversion layers. As the intermediate transparent conductive film of the present invention, any transparent conductive film commonly used for a solar battery cell may be employed, as long as it is conductive and transparent.

Specific examples of the intermediate transparent conductive film used in the present invention include transparent conductive films made of zinc oxide, ITO and others. Here, zinc oxide includes not only ZnO but also those of various compositions represented as $Zn_{m'}O_{n'}$ (m' and n' are positive integers). ITO is an abbreviation of Indium Tin Oxide.

Generally, ITO is superior in terms of low specific resistance. ZnO is advantageous in that its material cost is lower than that of ITO. Further, ZnO is highly resistant to plasma, and exhibits advantageously high transmittance of long-wavelength light.

In the case where the intermediate transparent conductive film used in the present invention is a transparent conductive film made of a material containing ZnO, it may be doped with impurity such as Al, Ga or the like, to lower its resistance. Among them, Ga is preferably used as the dopant, since it is superior in ability to lower resistance.

Further, the intermediate transparent conductive film used in the present invention preferably has a surface provided with irregularity. Fine irregularity provided to the surface of the intermediate transparent conductive film can scatter light within the power-generating region of the solar battery cell, resulting in an elongated optical path length. Accordingly, the power-generating efficiency of the solar battery cell is improved compared to the case where the intermediate transparent conductive film has a flat or even surface.

Here, the irregularity can be provided to the surface of the intermediate transparent conductive film of the present invention readily and accurately by etching with a common etchant.

In the case where the front electrode used in the present invention is a transparent conductive film, if the surface of the transparent conductive film as the front electrode is provided with irregularity, the surface of the intermediate transparent conductive film might be consequently provided with irregularity. However, even in such a case, the surface irregularity will gradually lessen as the photoelectric conversion layer is formed by stacking the semiconductor films on the transparent conductive film as the front electrode. Accordingly, it is still preferable to provide the intermediate transparent conductive film with the surface irregularity.

Back Electrode

The back electrode used in the present invention is formed on the side (herein, also referred to as the "back surface side") opposite from the light incident surface side of the stacked, two or more photoelectric conversion layers. As the back electrode of the present invention, any back electrode commonly used for a solar battery cell may be employed, as long as it is conductive and also scatters or reflects light.

Further, the back electrode used in the present invention is preferably made of a back transparent electrode and a back metal electrode stacked one another. Although the back electrode of the present invention may be formed solely of the back metal electrode, it is preferable that it also includes the back transparent electrode to promote scattering of light for higher power-generating efficiency.

Specific examples of the back metal electrode used in the present invention include metal films made of Ag, Al, Cr and others exhibiting high reflexivity of light.

Specific examples of the back transparent electrode used in the present invention include transparent conductive films made of tin oxide, zinc oxide, ITO and others. Here, tin oxide includes not only $SnO_2$ but also those of various compositions represented as $Sn_mO_n$ (m and n are positive integers). Similarly, zinc oxide includes not only ZnO but also those of various compositions represented as $Zn_{m'}O_{n'}$ (m' and n' are positive integers). ITO represents indium tin oxide.

Although ITO and $SnO_2$ are hardly different in transparency, it is generally considered that ITO is superior in terms of specific resistance and $SnO_2$ is superior in chemical stability. ZnO is advantageous in that its material cost is lower than that of ITO. Further, while $SnO_2$ suffers surface reduction due to plasma or the like, ZnO is highly resistant to plasma. ZnO also exhibits advantageously high transmittance of long-wavelength light.

Further, in the case where the back transparent electrode used in the present invention is a transparent conductive film made of a material containing ZnO, it may be doped with impurity such as Al, Ga or the like to lower the resistance thereof. Among them, Ga superior in ability to lower resistance is preferably used as the dopant.

Still further, the back transparent electrode used in the present invention preferably has a surface provided with irregularity. Fine irregularity provided to the surface of the back transparent electrode can scatter light within the power-generating region of the solar battery cell, thereby elongating the optical path length. This results in improved power-generating efficiency of the solar battery cell compared to the case where the back transparent electrode has a flat or even surface.

The surface irregularity of the back transparent electrode used in the present invention can be formed readily and accurately by etching with a common etchant.

Serial Stacked Structure

The solar battery cell of the present invention includes a plurality of power-generating regions connected in series, each having an insulative transparent substrate, a front electrode, an intermediate transparent conductive film, a photoelectric conversion layer formed of stacked semiconductor films, and a back electrode, and also includes a contact line electrically connecting the front electrode and the back electrode in the neighboring power-generating regions. One power-generating region has at least two photoelectric conversion layers stacked one another with the intermediate transparent conductive films sandwiched therebetween, and at least one member formed of nonconductor and/or semiconductor is provided between the intermediate transparent conductive film and the contact line to prevent direct contact therebetween.

For implementation of such a structure having a plurality of power-generating regions connected in series (herein, also referred to as the "serial stacked structure") in the solar battery cell of the present invention, it is necessary to make the front electrodes, the intermediate transparent conductive films, the photoelectric conversion layers and the back electrodes in the neighboring power-generating regions completely separated from each other. Further, the front electrodes and the back electrodes in the respective neighboring power-generating regions need to be connected in turn such that the solar battery cell of the present invention attains an integrated structure.

Thus, the solar battery cell of the present invention is provided with an open groove for separating the front electrodes (herein, also referred to as the "front electrode separating line"), an open groove for separating the photoelectric conversion layers (herein, also referred to as the "photoelectric conversion layer separating line"), an open groove for separating the intermediate transparent conductive films (herein, also referred to as the "intermediate transparent conductive film separating line"), and an open groove for separating the back electrodes (herein, also referred to as the "back electrode separating line").

Although each groove is not necessarily void, with a film-shaped semiconductor, electrode or the like possibly present or filled therein, it is herein called the "open" groove.

Further, to realize the serial stacked structure in the solar battery cell of the present invention, it is also necessary to provide a member for electrically connecting the front electrode and the back electrode (herein, also referred to as the "contact line").

Still further, to realize the serial stacked structure in the solar battery cell of the present invention, and to prevent reduction in output of the solar battery cell due to short circuit between the intermediate transparent conductive film and the contact line, it is also necessary to provide at least one member of nonconductor and/or semiconductor between the intermediate transparent conductive film and the contact line (herein, also referred to as the "intermediate transparent conductive film/contact line isolating member") to prevent direct contact between the intermediate transparent conductive film and the contact line.

Here, the intermediate transparent conductive film separating line may be of the shape completely separating both the intermediate transparent conductive films and the photoelectric conversion layers. Alternatively, it may be of the shape that does completely separate the intermediate transparent conductive films but does not completely separate the photoelectric conversion layers. In the latter case, it is required that the contact line provided inside the intermediate transparent conductive film separating line completely separate the photoelectric conversion layers, as described below.

The contact line electrically connecting the front electrode and the back electrode in the neighboring power-generating regions is preferably provided inside the intermediate transparent conductive film separating line. The contact line is preferably made of a material having the same composition with a portion of the back electrode. Further, the contact line preferably has a shape that completely separates the photoelectric conversion layers, as described above.

To prevent reduction in output of the solar battery cell due to short circuit between the intermediate transparent conductive film and the contact line, the above-described intermediate transparent conductive film/contact line isolating member is preferably provided inside the intermediate transparent conductive film separating line, in a shape that is inserted between the intermediate transparent conductive film and the contact line to prevent direct contact between the intermediate transparent conductive film and the contact line.

Preferably, the intermediate transparent conductive film/contact line isolating member is made of a material having the same composition with a portion of the photoelectric conversion layer that is provided on the back surface side of the intermediate transparent conductive film, as shown in FIG. 1, for simplification of the manufacturing process.

More preferably, the intermediate transparent conductive film/contact line isolating member is made of a material having the same composition with a semiconductor film that is included in the photoelectric conversion layer provided on the back surface side of the intermediate transparent conductive film and that is provided within the photoelectric conversion layer closest to the light incident side, for simplification of the manufacturing process.

Figure 2:
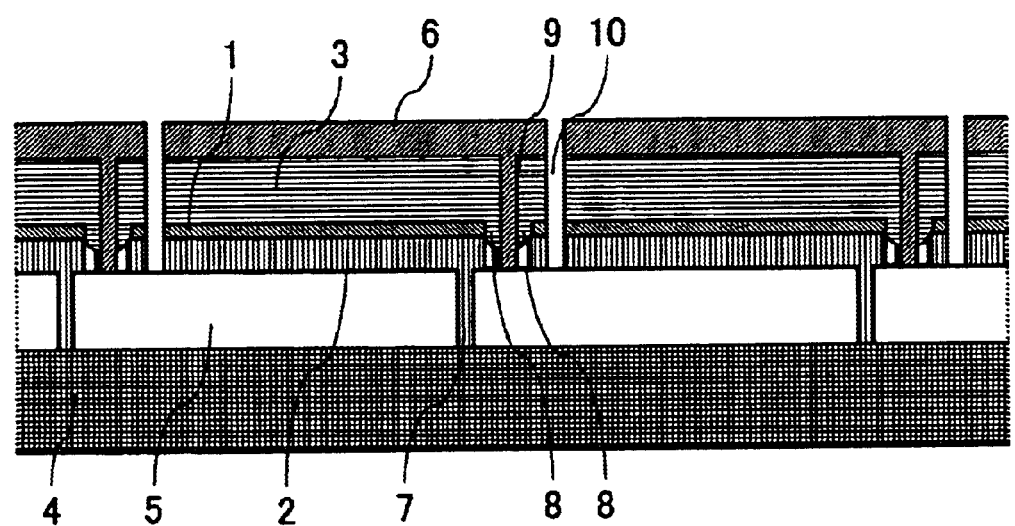
FIG. 2 is a schematic cross sectional view of a solar battery cell made in Example 2 of the present invention.

The intermediate transparent conductive film/contact line isolating member is not necessarily formed of a single material. For example, as shown in FIG. 2, it may be a composite member of a site that is formed of a material having the same composition with a portion of the photoelectric conversion layer provided on the light incident side of the intermediate transparent conductive film and a site that is formed of a material having the same composition with a portion of the photoelectric conversion layer provided on the back surface side of the intermediate transparent conductive film.

Alternatively, the intermediate transparent conductive film/contact line isolating member may be a composite member of a site that is formed of one or more semiconductors having the same composition(s) with one or more semiconductor films included in the photoelectric conversion layer provided on the light incident side of the intermediate transparent conductive film, and a site that is formed of a semiconductor having the same composition with a semiconductor film that is included in the photoelectric conversion layer provided on the back surface side of the intermediate transparent conductive film and that is provided within the photoelectric conversion layer closest to the light incident side.

That is, semiconductors such as Si, Ge, SiGe, SiC, SiN, GaAs, SiSn and others may be used as the material of the intermediate transparent conductive film/contact line isolating member. Among them, silicon based semiconductors of Si, SiGe, SiC and others are preferably employed.

The semiconductor as the material of the intermediate transparent conductive film/contact line isolating member may be crystalline semiconductor of, e.g., polycrystal or microcrystal type, or may be non-crystalline semiconductor of, e.g., amorphous type. This isolating member is required to suppress a leakage current between the intermediate transparent conductive film and the contact line. As the non-crystalline semiconductor and the polycrystal semiconductor, hydrogenated semiconductor is preferably used which has a chemical structure where a dangling bond otherwise causing a local level is ended with hydrogen.

Further, the semiconductor as the material of the intermediate transparent conductive film/contact line isolating member may be any of p type, i type and n type. Here, the p type and n type semiconductors can be formed by introducing prescribed impurities therein.

In the solar battery cell of the present invention, if a single power-generating region has two photoelectric conversion layers stacked one another with an intermediate transparent conductive film interposed therebetween, then the above-described intermediate transparent conductive film/contact line isolating member is preferably formed of a single layer, as shown in FIG. 1.

Figure 8:
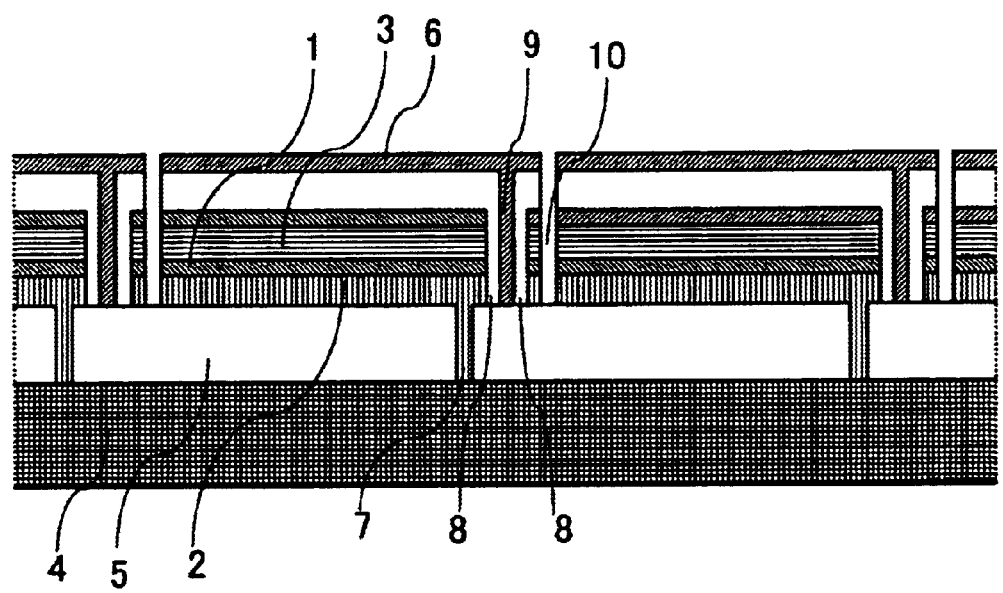
FIG. 8 is a schematic cross sectional view of another solar battery cell of the present invention.

In the solar battery cell of the present invention, if a single power-generating region has three or more photoelectric conversion layers stacked one another with the intermediate transparent conductive films interposed therebetween, the intermediate transparent conductive film/contact line isolating member is again preferably formed of a single layer as shown in FIG. 8, as in the case of the two photoelectric conversion layers. This is advantageous to simplification of the manufacturing process, although it depends on the thicknesses of the photoelectric conversion layers.

Manufacturing Method of Solar Battery Cell

The manufacturing method of a solar battery cell according to the present invention is the method of manufacturing the solar battery cell as described above. The method includes: an A step of forming a photoelectric conversion layer and forming an intermediate transparent conductive film on a back surface side of the photoelectric conversion layer in contact therewith; a B step of forming an intermediate transparent conductive film separating line that penetrates the intermediate transparent conductive film and a member sandwiched between the intermediate transparent conductive film and a front electrode to reach a back side surface of the front electrode; a C step of forming another photoelectric conversion layer on the back surface side of the intermediate transparent conductive film and in the intermediate transparent conductive film separating line to contact the intermediate transparent conductive film and an outer hull of the intermediate transparent conductive film separating line; and a D step of forming a contact line open groove that penetrates a back electrode and a member sandwiched between the back electrode and the front electrode to reach a back side surface of the front electrode. A cross section of the intermediate transparent conductive film separating line by a flat or curved plane in parallel with the transparent insulative substrate encloses a cross section of the contact line open groove by the relevant flat or curved plane.

Front Electrode Forming Step

Of the manufacturing method of the solar battery cell of the present invention, the step of forming the front electrode on the insulative transparent substrate (herein, also referred to as the "front electrode forming step") varies depending on whether the front electrode is a metal electrode or a transparent conductive film.

In the case where the front electrode used in the present invention is the metal electrode, a physical manufacturing method can be used in the front electrode forming step.

Examples of the physical manufacturing method include, but not limited to, vacuum evaporation, ion plating, sputtering, and magnetron sputtering. Among them, sputtering is preferably employed from the standpoint of quality.

In the case where the front electrode used in the present invention is formed of the transparent conductive film, a chemical manufacturing method or a physical manufacturing method can be employed in the front electrode forming step.

Examples of the chemical manufacturing method include, but not limited to, spraying, CVD, and plasma CVD. Generally, the chemical manufacturing method is for forming an oxide film on a substrate by thermal decomposition or oxidation of chloride or organic metal compound, of which process cost is advantageously inexpensive.

On the other hand, examples of the physical manufacturing method include, but not limited to, vacuum evaporation, ion plating, sputtering, and magnetron sputtering. Generally, the physical manufacturing method permits formation of a film of good quality, with a lower substrate temperature than in the chemical manufacturing method. With the physical manufacturing method, however, the deposition rate would drop, and the device cost would increase.

Front Electrode Patterning Step

Of the manufacturing method of the solar battery cell of the present invention, the step of patterning the front electrode to form the front electrode separating line (herein, also referred to as the "front electrode patterning step") may be performed using any patterning technique commonly used for patterning a metal electrode or a transparent conductive film, as long as it ensures accurate patterning.

In the front electrode patterning step of the present invention, patterning may be carried out, e.g., by etching employing a resin or metal mask. With this method, however, a large number of processes are required for formation of the stacked structure. In addition, it can handle only the substrates of a limited dimensional range, and the effective area of the power-generating regions within the substrate of the solar battery would become small. Pinholes would be generated in the photoelectric conversion layer with such a wet process, and patterning would be difficult in the case of a substrate having a curved surface.

Thus, in the front electrode patterning step of the present invention, patterning utilizing heating by laser irradiation (herein, also referred to as "laser patterning") is preferably carried out. Such laser patterning can reduce the number of processes required for forming the stacked structure. It also makes it possible to form a solar battery cell on a substrate of large area, or even on a substrate of an arbitrary structure such as one having a curved surface. The effective area of the power-generating regions within the substrate of the solar battery also increases. This patterning is conveniently suitable for continuous production and automated production.

As the laser used in laser patterning in the front electrode patterning step of the present invention, any laser commonly used in manufacture of a solar battery cell may be employed.

Preferably, a distance between the laser exit and the irradiated surface, a diameter of the laser on the irradiated surface, a time for the laser irradiation and other conditions are selected as appropriate in accordance with a shape to be patterned or the like.

It is preferable that the substrate and the front electrode are cleaned with purified water after the front electrode patterning step of the present invention, prior to the step of forming photoelectric conversion layer and intermediate transparent conductive film.

Step of Forming Photoelectric Conversion Layers and Intermediate Transparent Conductive Film: A Step Of the manufacturing method of the solar battery cell of the present invention, the step of forming two or more photoelectric conversion layers stacked on the front electrode (herein, also referred to as the "photoelectric conversion layer forming step") may be carried out using a chemical or physical manufacturing method.

Examples of the chemical manufacturing method usable in the photoelectric conversion layer forming step include spraying, CVD, and plasma CVD. In general, the chemical manufacturing method of semiconductor is for forming a semiconductor film on a substrate by thermal decomposition or plasma reaction of source gas such as silane gas, of which process cost is advantageously inexpensive.

Examples of the physical manufacturing method include vacuum evaporation, ion plating, sputtering, and magnetron sputtering. In general, the physical manufacturing method permits formation of a film of good quality, with a lower substrate temperature than in the case of the chemical manufacturing method, although it may be slow in deposition rate and expensive in device cost.

Of these manufacturing methods, plasma CVD is preferable from the standpoint of quality.

Of the manufacturing method of the solar battery cell of the present invention, the step of forming the intermediate transparent conductive film (herein, also referred to as the "intermediate transparent conductive film forming step") may also be carried out using either the chemical manufacturing method or the physical manufacturing method.

Examples of the chemical manufacturing method usable in the intermediate transparent conductive film forming step include, but not limited to, spraying, CVD, and plasma CVD. In general, the chemical manufacturing method is for forming an oxide film on a substrate by thermal decomposition or oxidation of chloride or organic metal compound, or for forming a semiconductor film on a substrate by thermal decomposition or plasma reaction of source gas such as silane gas. The process cost is advantageously inexpensive in the chemical manufacturing method.

Examples of the physical manufacturing method include vacuum evaporation, ion plating, sputtering, and magnetron sputtering. In general, the physical manufacturing method permits formation of a film of good quality, with a lower substrate temperature than in the case of the chemical manufacturing method, although the deposition rate would be slow and the device cost would increase.

Of these manufacturing methods, sputtering is preferable from the standpoint of quality.

In the case where the intermediate transparent conductive film is to be provided with surface irregularity, it is necessary to conduct the step (texture etching step) of forming the irregularity at the surface of the intermediate transparent conductive film by etching with an etchant.

Here, as the etchant for use in the texture etching step, any solution capable of dissolving the intermediate transparent conductive film to provide the surface irregularity may be employed. From the standpoint of good solubility, for example, an acid solution or an alkaline solution is preferably employed.

The type and concentration of the acid or alkaline solution and etching time cannot be fixed, since the appropriate type and range vary depending on the material and forming conditions of the intermediate transparent conductive film.

In the case where the intermediate transparent conductive film is formed of a material containing zinc oxide, it is particularly preferable to use an acid solution such as acetic acid, hydrochloric acid, sulfuric acid or nitric acid or an alkaline solution such as sodium hydroxide or potassium hydroxide as the etchant, from the standpoint of good solubility. Of these etchants, acetic acid is most preferable.

The concentration of the acid or alkaline solution is preferably not less than 0.5% (w/w) and not more than 5% (w/w).

Further, the etching time is preferably not less than one minute and not more than two minutes.

In the case where such a texture etching step of the intermediate transparent conductive film is to be incorporated in the manufacturing method of the solar battery cell of the present invention, it is necessary to provide and conduct the following steps in the following order: the step of forming an upper photoelectric conversion layer that is the photoelectric conversion layer provided in contact with an intermediate transparent conductive film on the light incident surface side thereof; the step of forming the intermediate transparent conductive film on the upper photoelectric conversion layer; the step of providing surface irregularity to the intermediate transparent conductive film by etching with an etchant; the step of forming an intermediate transparent conductive film separating line; and the step of forming, on the intermediate transparent conductive film, a lower photoelectric conversion layer that is the photoelectric conversion layer provided in contact with the intermediate transparent conductive film on the opposite side from the light incident surface side thereof.

Photoelectric Conversion Layer and Intermediate Transparent Conductive Film Patterning Step: B Step Of the manufacturing method of the solar battery cell of the present invention, the step of patterning the photoelectric conversion layers and the intermediate transparent conductive film to form the intermediate transparent conductive film separating line (herein, also referred to as the photoelectric conversion layer and intermediate transparent conductive film patterning step) may be carried out suitably using any patterning technique generally used for patterning a photoelectric conversion layer and a transparent conductive film, as long as it ensures accurate patterning.

In the manufacturing method of the solar battery cell of the present invention, the photoelectric conversion layer and the intermediate transparent conductive film may be patterned separately from each other. However, it is preferable to pattern them collectively for simplification of the manufacturing process and for reduction of the manufacturing cost.

In the photoelectric conversion layer and intermediate transparent conductive film patterning step of the present invention, patterning may be conducted, e.g., by etching using a resin or metal mask. With this method, however, a large number of processes are required for formation of the stacked structure. In addition, it can handle only the substrates of a limited dimensional range, and the effective area of the power-generating regions within the substrate of the solar battery would be small. Pinholes would be generated in the photoelectric conversion layer with such a wet process, and patterning would be difficult in the case of a substrate having a curved surface.

Thus, in the photoelectric conversion layer and intermediate transparent conductive film patterning step of the present invention, patterning utilizing heating by laser irradiation (herein, also referred to as "laser patterning") is preferably employed. Such laser patterning can reduce the number of processes required for forming the stacked structure. It also makes it possible to form a solar battery cell on a substrate of large area, or even on a substrate of an arbitrary structure such as one having a curved surface. The effective area of the power-generating regions within the substrate of the solar battery also increases. This patterning is conveniently suitable for continuous production and automated production.

As the laser for use in laser patterning in the photoelectric conversion layer and intermediate transparent conductive film patterning step of the present invention, in the case where the front electrode is formed of a transparent conductive film, laser of a visible light range having excellent transmittance with respect to the transparent conductive film is preferably used to prevent an adverse effect on the transparent conductive film. YAG SHG laser, for example, is preferably used.

Preferably, a distance between the laser exit and the irradiated surface, a time for the laser irradiation and others are selected as appropriate in accordance with a shape to be patterned or the like.

In manufacture of the solar battery cell as shown in FIG. 1, for example, when the intermediate transparent conductive film separating line is being formed using the laser as described above, the laser processing conditions are preferably selected such that the intermediate transparent conductive film separating line penetrates the intermediate transparent conductive film and the member sandwiched between the intermediate transparent conductive film and the front electrode to reach the back side surface of the front electrode.

Further, in manufacture of the solar battery cell as shown in FIG. 2, for example, when the intermediate transparent conductive film separating line is being formed using the laser as described above, the laser processing conditions are preferably selected such that the intermediate transparent conductive film separating line penetrates the intermediate transparent conductive film and partially removes the photoelectric conversion layer provided on the light incident side of the intermediate transparent conductive film. In this case, the contact line as will be described below needs to have a shape which ensures complete separation of the photoelectric conversion layers.

Step of Forming Another Photoelectric Conversion Layer: C Step

Of the manufacturing method of the solar battery cell of the present invention, the step of forming another photoelectric conversion layer on the back surface side of the intermediate transparent conductive films, separated by the intermediate transparent conductive film separating line in the above-described step, and inside the intermediate transparent conductive film separating line to contact the intermediate transparent conductive film and an outer hull of the intermediate transparent conductive film separating line (herein, also referred to as the step of forming another photoelectric conversion layer) may be carried out using a chemical or physical manufacturing method.

Examples of the chemical manufacturing method usable in the photoelectric conversion layer forming step include spraying, CVD, and plasma CVD. Generally, the chemical manufacturing method of semiconductor is for forming a semiconductor film on a substrate by thermal decomposition or plasma reaction of a source gas such as silane gas, of which process cost is advantageously inexpensive.

Examples of the physical manufacturing method include vacuum evaporation, ion plating, sputtering, and magnetron sputtering. In general, the physical manufacturing method permits formation of a film of good quality, with a lower substrate temperature than in the chemical manufacturing method. With the physical manufacturing method, however, the deposition rate would be slow, and the device cost would increase.

Of these manufacturing methods, plasma CVD is preferably used from the standpoint of quality.

Formed inside the intermediate transparent conductive film separating line may be only a portion of the photoelectric conversion layer, i.e., only the semiconductor film within the photoelectric conversion layer that is closest to the light incident side, for example.

During the photoelectric conversion layer forming step, only the outer hull of the intermediate transparent conductive film separating line may be entirely covered with the relevant portion of the photoelectric conversion layer, or the inside of the intermediate transparent conductive film separating line may be fully filled with the relevant portion of the photoelectric conversion layer.

Here, the A step, B step and C step are preferably performed sequentially in this order. Performing the A step, B step and C step one time each permits formation of the solar battery cell as shown in FIG. 1 wherein one power-generating region has two photoelectric conversion layers stacked one another with an intermediate transparent conductive film sandwiched therebetween.

Step of Forming Contact Line and Back Electrode: D Step

Of the manufacturing method of the solar battery cell of the present invention, the step of forming the contact line can be considered as a combination of the step of forming an open groove necessary for formation of the contact line (herein, also referred to as the contact line open groove) and the step of filling the contact line open groove with a conductive substance (herein, the material of the conductive substance is also referred to as the material of the contact line).

Here, in the present invention, the step of patterning the photoelectric conversion layer and the intermediate transparent conductive film to form the contact line open groove (herein, also referred to as the contact line open groove forming step) may be carried out suitably employing any technique generally used for patterning a photoelectric conversion layer and a transparent conductive film, as long as it ensures accurate patterning.

Further, in the step of forming the contact line open groove of the present invention, the photoelectric conversion layer and the intermediate transparent conductive film may be patterned separately from each other. However, they are preferably patterned together for simplification of the manufacturing process and for reduction of the manufacturing cost.

In the step of forming the contact line open groove of the present invention, patterning may be conducted, e.g., by etching using a resin or metal mask. With this method, however, a large number of processes are required for formation of the stacked structure. In addition, it can handle only the substrates of a limited dimensional range, and the effective area of the power-generating regions within the substrate of the solar battery would be small. Pinholes would be generated in the photoelectric conversion layer with the wet process, and patterning would be difficult in the case of a substrate having a curved surface.

Thus, in the step of forming the contact line open groove of the present invention, patterning utilizing heating by laser irradiation (herein, also referred to as "laser patterning") is preferably employed. Such laser patterning can reduce the number of processes required for forming the stacked structure. It also makes it possible to form a solar battery cell on a substrate of large area, or even on a substrate of an arbitrary structure such as one having a curved surface. The effective area of the power-generating regions within the substrate of the solar battery also increases. This patterning is conveniently suitable for continuous production and automated production.

As the laser for use in laser patterning in the step of forming the contact line open groove of the present invention, in the case where the front electrode is formed of a transparent conductive film, laser of a visible light range having excellent transmittance with respect to the transparent conductive film is preferably used to prevent an adverse effect on the transparent conductive film. As such, YAG SHG laser, for example, is preferably used.

It is preferable that the laser used in this step has a maximum diameter of the beam cross section that is smaller than that of the laser used in the B step. If the beam cross section of the laser used in this step has the maximum diameter greater than that of the laser used in the B step, laser processing needs to be repeated a plurality of number of times in the B step to form the intermediate transparent conductive film separating line that can sufficiently separate the intermediate transparent conductive film from the contact line. This leads to degradation of productivity.

A distance between the laser exit and the irradiated surface, a diameter of the laser on the irradiated surface, and laser processing conditions are preferably selected as appropriate in accordance with a shape to be patterned or the like.

Specifically, the laser processing conditions are preferably selected such that the contact line open groove penetrates the member sandwiched between the back electrode and the front electrode to reach the back side surface of the front electrode.

The contact line open groove of the present invention is preferably provided inside the intermediate transparent conductive film separating line. That is, in the contact line open groove forming step of the present invention, laser patterning is preferably conducted by aiming the laser at a position ensuring that a cross section of the intermediate transparent conductive film separating line by a planar or curved plane in parallel with the transparent insulative substrate encloses a cross section of the contact line open groove by the same planar or curved plane.

Contact Line Filling Step and Back Electrode Forming Step

Of the manufacturing method of the solar battery cell of the present invention, the conductive substance used in the step of filling the contact line open groove with a conductive substance (herein, also referred to as the contact line filling step) may be any conductive substance commonly used in a solar battery cell.

In the case where the back electrode is formed of a back metal electrode and a back transparent electrode, a conductive substance made of the same material as the back transparent electrode is preferably used as the conductive substance described above, from the standpoint of simplification of the manufacturing process.

Thus, the contact line filling step of the present invention is preferably the same step as the step of forming the back transparent electrode in the step of forming the back electrode. It is desired that the contact line open groove is completely filled with the conductive substance through the contact line filling step, to make the front electrode and the back electrode completely electrically connected with each other.

Of the manufacturing method of the solar battery cell of the present invention, the step of forming the back electrode (herein, also referred to as the back electrode forming-step) varies depending on the material and structure of the back electrode.

Here, as described above, the back electrode used in the present invention preferably has the back transparent electrode and the back metal electrode stacked one another. Although the back electrode of the present invention may be formed solely of the back metal electrode, it is desirable that the back transparent electrode is also provided for the purposes of promoting scattering of light to obtain higher power-generating efficiency.

The back metal electrode used in the present invention is preferably made by a physical manufacturing method. Examples of the physical manufacturing method include vacuum evaporation, ion plating, sputtering, and magnetron sputtering. Of these manufacturing methods, sputtering is preferably employed from the standpoint of quality.

The back transparent electrode used in the present invention may be formed by a physical or chemical manufacturing method.

Examples of the chemical manufacturing method include spraying, CVD, and plasma CVD. Generally, the chemical manufacturing method is for forming an oxide film on a substrate by thermal decomposition or oxidation of chloride or organic metal compound, of which the process cost is advantageously inexpensive.

On the other hand, examples of the physical manufacturing method include vacuum evaporation, ion plating, sputtering, and magnetron sputtering. Generally, the physical manufacturing method permits formation of a film of good quality, with a lower substrate temperature than in the chemical manufacturing method. With the physical manufacturing method, however, the deposition rate would be slow, and the device cost would increase.

Of these manufacturing methods, sputtering is preferably used from the standpoint of quality or the like.

Back Electrode Patterning Step

Of the manufacturing method of the solar battery cell of the present invention, the step of patterning the back electrode to form the back electrode separating line (herein, also referred to as the back electrode patterning step) may be carried out employing any patterning technique generally used for patterning a metal electrode or a transparent conductive film, as long as it ensures accurate patterning.

In the back electrode patterning step of the present invention, patterning by etching using a resin or metal mask, for example, may be employed. With this patterning, however, a large number of processes are required for formation of the stacked structure. In addition, it can handle only the substrates of a limited dimensional range, and the effective area of the power-generating regions within the substrate of the solar battery would be small. Pinholes would be generated in the photoelectric conversion layer with such a wet process, and patterning would be difficult in the case of a substrate having a curved surface.

Thus, in the back electrode patterning step of the present invention, patterning utilizing heating by laser irradiation (herein, also referred to as "laser patterning") is preferably performed. Such laser patterning can reduce the number of processes required for forming the stacked structure. It also makes it possible to form a solar battery cell on a substrate of large area, or even on a substrate of an arbitrary structure such as one having a curved surface. The effective area of the power-generating regions within the substrate of the solar battery also increases. This patterning is conveniently suitable for continuous production and automated production.

As the laser for use in laser patterning in the back electrode patterning step of the present invention, laser of a visible light range having excellent transmittance with respect to the transparent conductive film is preferably used to prevent an adverse effect on the front electrode formed of the transparent conductive film. YAG SHG laser, for example, is preferably used.

Preferably, a distance between the laser exit and the irradiated surface, a diameter of the laser on the irradiated surface, and laser processing conditions are selected as appropriate in accordance with a shape to be patterned or the like. The back electrode patterning step of the present invention is preferably followed by ultrasonic cleaning of the substrate and the front electrode in purified water.

The solar battery cell of the present invention manufactured by the method described above is suitably employed as a primary member of the solar battery, where it may be used alone or a plurality of such solar battery cells may be combined together. Alternatively, it may be combined with another kind of solar battery cell.

Hereinafter, the present invention will be described in more detail by giving examples, although the present invention is not limited thereto.

EXAMPLE 1

Example 1 is described with reference to FIG. 1. FIG. 1 shows a schematic cross section of the solar battery cell made in Example 1.

Firstly, a glass substrate having a thickness of about 4.0 mm and a substrate size of 650 mm×910 mm is prepared as an insulative transparent substrate 4. A transparent conductive film of $SnO_2$ (tin oxide) is deposited on insulative transparent substrate 4 by thermal CVD, to form a front electrode 5.

Next, the fundamental wave of YAG laser is used to pattern front electrode 5. That is, laser beam is irradiated from the insulative transparent substrate 4 side to divide front electrode 5 into rectangular portions to form a front electrode separating line 7.

Thereafter, the substrate is subjected to ultrasonic cleaning with purified water. Semiconductor films are then stacked on front electrode 5 and filled inside front electrode separating line 7 by plasma CVD to form a photoelectric conversion layer as an upper cell 2. Upper cell 2 thus formed is the photoelectric conversion layer having a p layer of a-Si:H, an i layer of a-Si:H and an n layer of a-Si:H stacked sequentially in this order from the insulative transparent substrate 4 side, to a total thickness of about 0.2 $\mu$m.

Next, an intermediate transparent conductive film 1 of ZnO (zinc oxide) is deposited on upper cell 2 by magnetron sputtering to have a thickness of about 45 nm.

Thereafter, the second harmonic generation of YAG laser is irradiated from the insulative transparent substrate 4 side to pattern upper cell 2 and intermediate transparent conductive film 1. As a result, upper cell 2 and intermediate transparent conductive film 1 are divided into rectangular portions, and an intermediate transparent conductive film separating line 8 is formed which penetrates intermediate transparent conductive film 1 and upper cell 2 to reach a back side surface of front electrode 5. At this time, as shown in FIG. 3, intermediate transparent conductive film separating line 8 is made to have a width 15 of about 150 $\mu$m.

Next, semiconductor films are stacked on intermediate transparent conductive film 1 and filled inside intermediate transparent conductive film separating line 8 by plasma CVD to form a photoelectric conversion layer as a lower cell 3. Lower cell 3 thus formed is the photoelectric conversion layer having a p layer of $\mu$c-Si:H, an i layer of $\mu$c-Si:H and an n layer of $\mu$c-Si:H stacked sequentially in this order from the insulative transparent substrate 4 side, to a total thickness of about 2 $\mu$m.

Next, the second harmonic generation of YAG laser is irradiated from the insulative transparent substrate 4 side to pattern lower cell 3. As a result, lower cell 3 is divided into rectangular portions, and a contact line open groove 9 for electrically connecting front transparent electrode 5 with back electrode 6 is formed.

Figure 3:
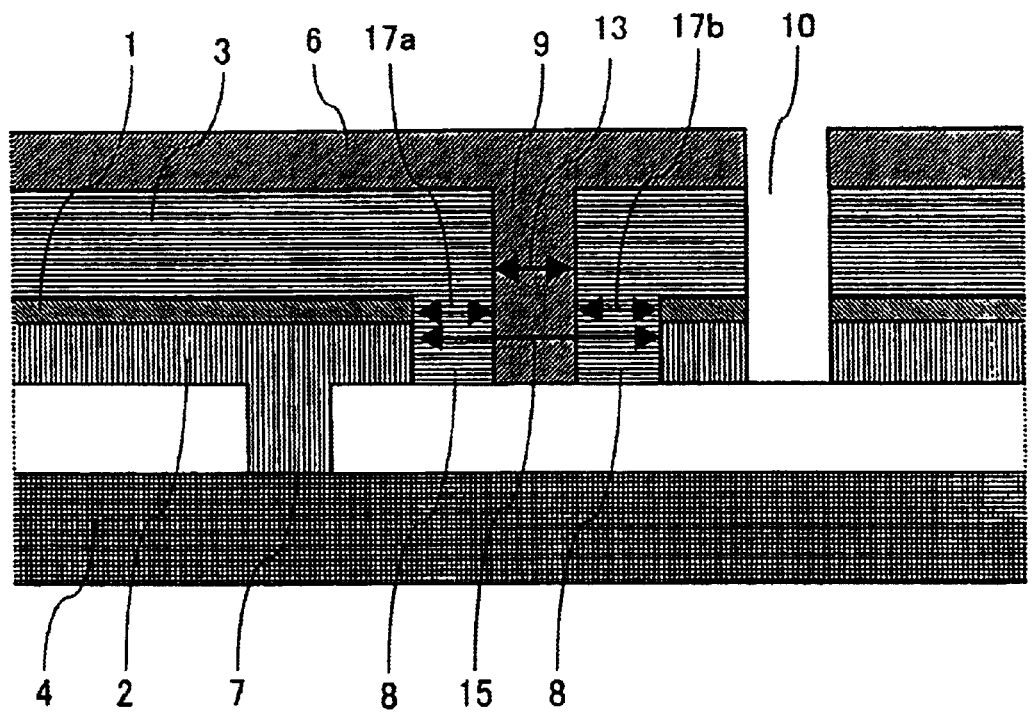
FIG. 3 is an enlarged schematic cross sectional view of a portion of the solar battery cell of the Example 1 in the vicinity of the contact line.
Figure 5:
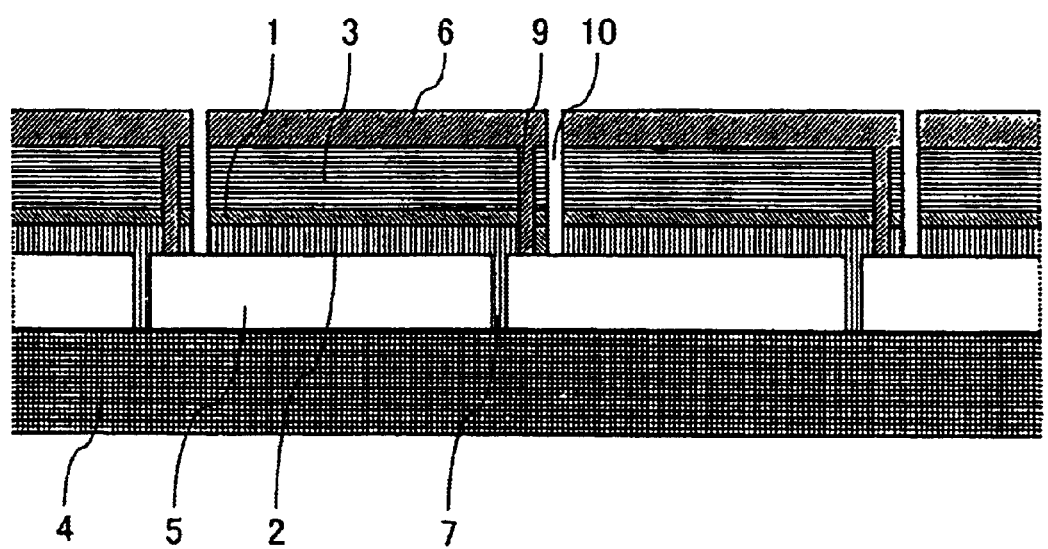
FIG. 5 is a schematic cross sectional view of a typical example of a serial stacked type solar battery cell conventionally known.

As seen from FIG. 3, when back electrode 6 is being formed, if a width 13 of contact line open groove 9 is as large as the width 15 of intermediate transparent conductive film separating line 8, intermediate transparent conductive film 1 would come to direct contact with back electrode 6, as in the case of FIG. 5. It would make upper cell 2 short-circuited, thereby decreasing the output of the solar battery cell to less than half the expected value.

Thus, in the present example, contact line open groove 9 has been formed to have width 13 that is smaller than width 15 of intermediate transparent conductive film separating line 8, as shown in FIG. 13. As width 13 of contact line open groove 9 is reduced, the intermediate transparent conductive film/contact line isolating member of a material having the same composition as lower cell 3 comes to partially fill intermediate transparent conductive film separating line 8. This can isolate the conductive substance filled in contact line open groove 9 that is made of a material having the same composition with intermediate transparent conductive film 1 and back electrode 6. As a result, short circuit of upper cell 2 is prevented.

At this time, width 13 of contact line open groove 9 is made to be about 80 µm, and a distance 17a from intermediate transparent conductive film 1 to contact line open groove 9 is made to be about 50 µm. A distance 17b from intermediate transparent conductive film 1 to contact line open groove 9 on the opposite side from distance 17a is made to be about 20 µm.

Next, magnetron sputtering is used to form a back electrode 6 with a back transparent electrode of ZnO (zinc oxide) and a back metal electrode of Ag. At this time, back electrode 6 has a thickness of about 350 nm. The inside of contact line open groove 9 is filled with a material having the same composition as that of back electrode 6.

Next, to prevent damages to front electrode 5 by laser, the second harmonic generation of YAG laser having excellent transmittance with respect to front electrode 5 is irradiated from the insulative transparent substrate 4 side to pattern back electrode 6. As a result, back electrode 6 is divided into rectangular portions, and a back electrode separating line 10 is formed. Thereafter, the substrate is subjected to ultrasonic cleaning in purified water, followed by drying. Bus bars are attached to positive and negative electrodes. Thus, the solar battery cell (I) of the present example is completed.

Performance evaluation of the solar battery cell (I) thus made (substrate size: 650 mm×910 mm) was conducted using a solar simulator, and the measurement results of Isc: 0.936 A, Voc: 75.6 V, F.F.: 0.71, and Pmax: 50.2 W were obtained at AM 1.5 (100 mW/cm$^2$).

EXAMPLE 2

A solar battery cell was made in the same manner as in Example 1, except that the shape of intermediate transparent conductive film separating line 8 was changed to a curved surface. As a result, a solar battery cell (II) having the structure shown in FIG. 2 was obtained.

A solar simulator was used to carry out performance evaluation of the solar battery cell (II) thus obtained (substrate size: 650 mm×910 mm). The measurement results at AM 1.5 (100 mW/cm$^2$) were Isc: 0.936A, Voc: 75.6 V, F.F.: 0.71, and Pmax: 50.2 W.

COMPARATIVE EXAMPLE 1

Figure 6:
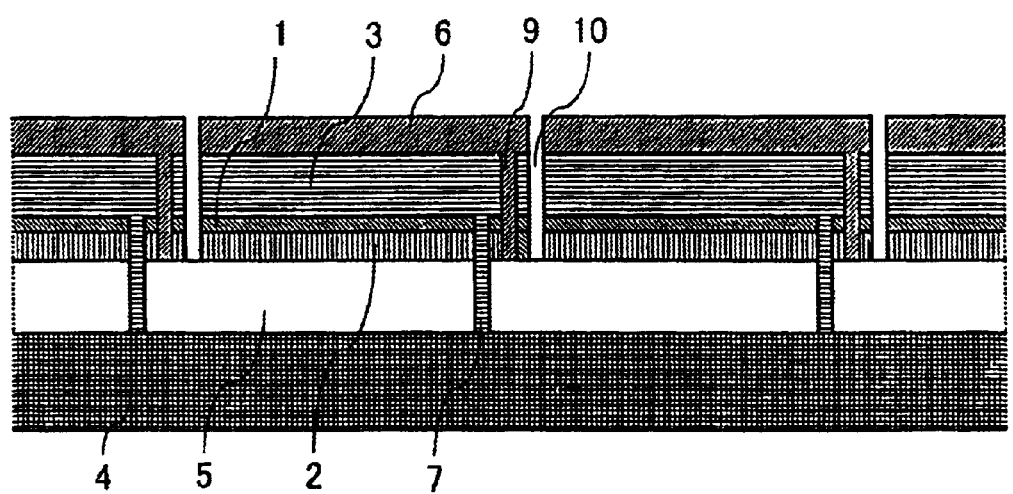
FIG. 6 is a schematic cross sectional view of the solar battery cell made in Comparative Example 1.
Figure 7:
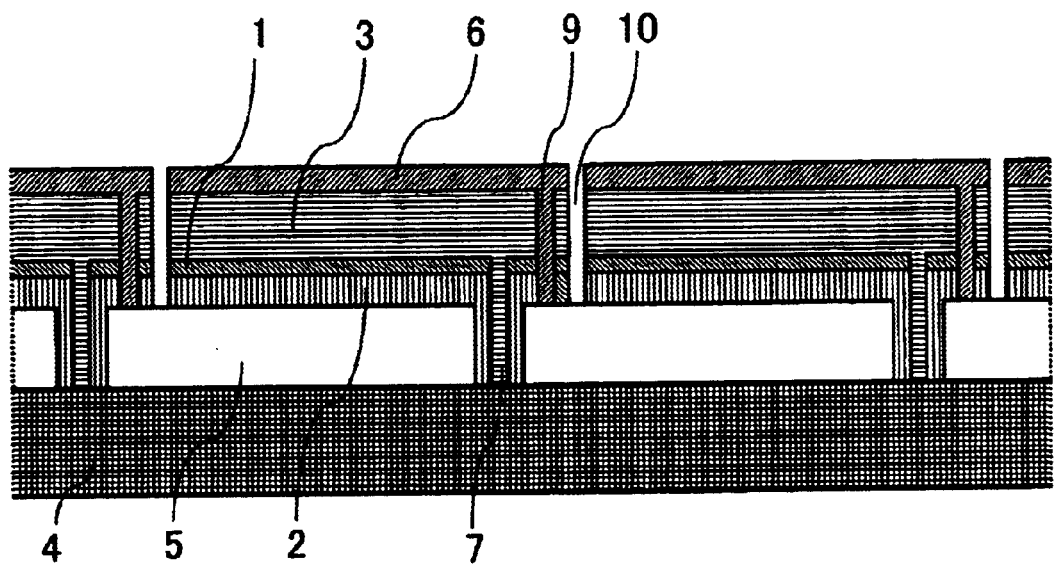
FIG. 7 is a schematic cross sectional view of a solar battery cell disclosed in Japanese Patent Laying-Open No. 9-129906.

Hereinafter, Comparative Example 1 is described with reference to FIG. 6. FIG. 6 shows a schematic cross section of a solar battery cell made in Comparative Example 1. This solar battery cell has the same structure as the integrated structure disclosed in Japanese Patent Laying-Open No. 9-129903.

Firstly, a glass substrate of a thickness of about 4.0 mm and having a substrate size of 650 mm×910 mm is prepared as an insulative transparent substrate 4. A transparent conductive film of SnO$_2$ (tin oxide) is deposited on insulative transparent substrate 4 by thermal CVD as a front electrode 5.

Next, semiconductor films are stacked on front electrode 5 by plasma CVD, to form a photoelectric conversion layer as an upper cell 2. Upper cell 2 thus formed is the photoelectric conversion layer having a p layer of a-Si:H, an i layer of a-Si:H and an n layer of a-Si:H stacked sequentially in this order from the insulative transparent substrate 4 side, to a total thickness of about 0.2 µm.

Thereafter, an intermediate transparent conductive film 1 of ZnO (zinc oxide) is formed on upper cell 2 by magnetron sputtering to a thickness of about 45 nm.

The fundamental wave of YAG laser is used to collectively pattern front electrode 5, upper cell 2 and intermediate transparent conductive film 1. That is, the laser beam is irradiated from the insulative transparent substrate 4 side to divide front electrode 5, upper cell 2 and intermediate transparent conductive film 1 into rectangular portions, to form a front electrode separating line 7.

Subsequently, the substrate is subjected to ultrasonic cleaning with purified water. Semiconductor films are then stacked on intermediate transparent conductive film 1 and filled inside front electrode separating line 7 by plasma CVD, to form a photoelectric conversion layer as a lower cell 3. Lower cell 3 thus formed is the photoelectric conversion layer having a p layer of µc-Si:H, an i layer of µc-Si:H and an n layer of µc-Si:H stacked sequentially in this order from the insulative transparent substrate 4 side, to a total thickness of about 2 µm.

Next, the second harmonic generation of YAG laser is irradiated from the insulative transparent substrate 4 side to pattern upper cell 2, intermediate transparent conductive film 1 and lower cell 3. As a result, upper cell 2, intermediate transparent conductive film 1 and lower cell 3 are divided into rectangular portions, and a contact line open groove 9 is formed which penetrates upper cell 2, intermediate transparent conductive film 1 and lower cell 3 to reach the back side surface of front electrode 5 and also electrically connects front transparent electrode 5 with back electrode 6.

Next, magnetron sputtering is employed to form a back electrode 6 with a back transparent electrode of ZnO (zinc oxide) and a back metal electrode of Ag, to a total thickness of about 350 nm. The inside of contact line open groove 9 is filled with a material having the same composition as that of back electrode 6.

Next, to prevent damages to front electrode 5 due to laser, the second harmonic generation of YAG laser having excellent transmittance with respect to front electrode 5 is irradiated from the insulative transparent substrate 4 side to pattern back electrode 6. As a result, back electrode 6 is divided into rectangular portions, and a back electrode separating line 10 is formed. Thereafter, the substrate is subjected to ultrasonic cleaning in purified water, followed by drying. Bus bars are attached to positive and negative electrodes, and thus, the solar battery cell (III) of the comparative example is completed.

Performance evaluation of the solar battery cell (III) (substrate size: 650 mm×910 mm) formed as described above was carried out using a solar simulator.

Figure 4:
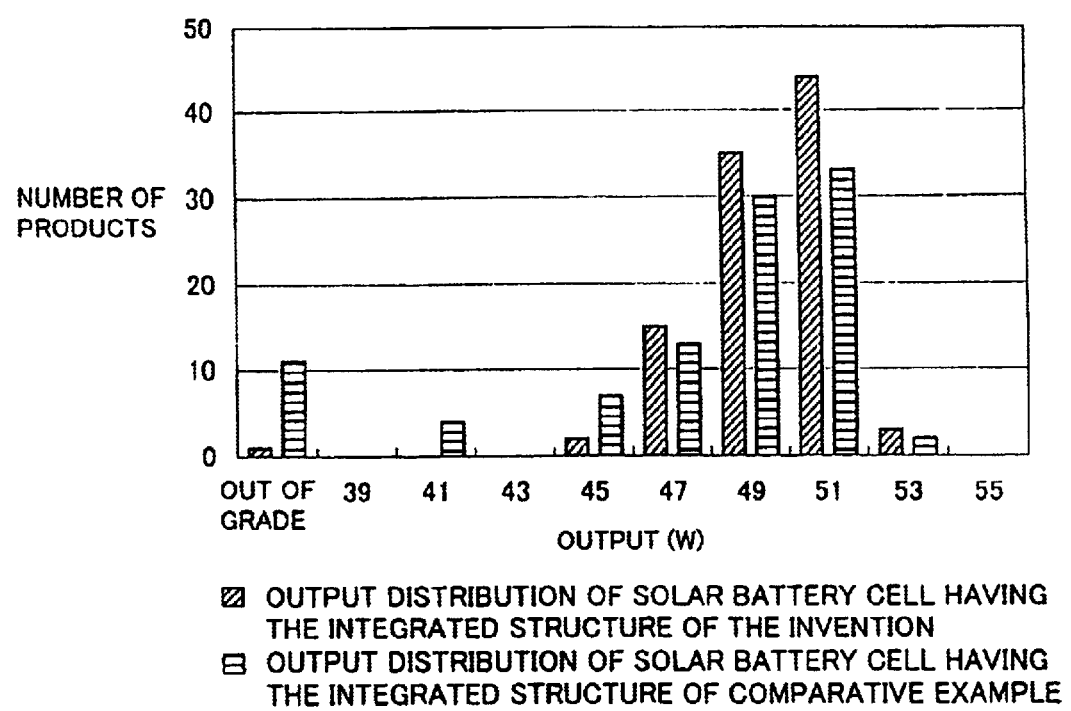
FIG. 4 is a histogram showing output distributions of solar battery cells made in the inventive Example 1 and Comparative Example 1.

FIG. 4 is a histogram showing output distributions of the solar battery cell (I) obtained in Example 1 and the solar battery cell (III) obtained in Comparative Example 1. It is understood from FIG. 4 that the solar battery cell (I) of Example 1 exhibits a good manufacturing yield. It is also understood that the solar battery cell (III) of Comparative Example 1 is poor in yield compared to the solar battery cell (I) of Example 1.

The reason is considered as follows. As seen from FIG. 6, front electrode separating line 7 of the solar battery cell (III) of Comparative Example 1 is formed by collectively laser patterning front electrode 5, upper cell 2 and intermediate transparent conductive film 1. Thus, even if front electrodes 5 in the neighboring power-generating regions are completely separated from each other, sublimated front electrode 5 would be redeposited on the side surfaces of upper cells 2, which is very likely to cause short circuit between intermediate transparent conductive film 1 and front electrode 5. This in turn makes upper cell 2 short-circuited, thereby degrading the output of the solar battery cell.

Further, in a region where the lower cell is directly deposited on the glass substrate, film is partially peeled off, degrading the appearance. Such a cell is also degraded in properties.

Based on the foregoing results, the solar battery cell of the present invention has a novel serial stacked structure where at least one member formed of nonconductor and/or semiconductor is provided between the intermediate transparent conductive film and the contact line, to prevent direct contact of the intermediate transparent conductive film with the contact line. Accordingly, it exhibits an excellent effect of increasing scattering of light, is excellent in power-generating efficiency per unit area, and ensures high reliability and a good yield during the manufacturing process thereof.

Further, using the manufacturing method of the solar battery cell of the present invention makes it possible to manufacture, with high reliability and a good yield, a solar battery cell having a serial stacked structure which exhibits an excellent effect of increasing scattering of light and is excellent in power-generating efficiency per unit area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar battery cell comprising:
    a plurality of power-generating regions connected in series, each having an insulative transparent substrate, a front electrode, an intermediate transparent conductive film, a photoelectric conversion layer formed of stacked semiconductor films, and a back electrode, and further including a contact line electrically connecting the front electrode and the back electrode of the respective neighboring power-generating regions,
    wherein each said power-generating region has at least two said photoelectric conversion layers stacked one another with said intermediate transparent conductive film interposed therebetween, and that at least one member formed of nonconductor and/or semiconductor is provided between each said intermediate transparent conductive film and each said contact line to prevent each said intermediate transparent conductive film and each said contact line from directly contacting each other.

2. The solar battery cell according to claim 1, wherein each said power-generating region has two said photoelectric conversion layers stacked one another with the intermediate transparent conductive film sandwiched therebetween.

3. The solar battery cell according to claim 1, wherein the at least one member formed of nonconductor and/or semiconductor provided between said intermediate transparent conductive film and said contact line is a member formed of a semiconductor having a same composition with the semiconductor film included in the photoelectric conversion layer provided on a back surface side of the intermediate transparent conductive film and provided within said photoelectric conversion layer closest to a light incident side.

4. The solar battery cell according to claim 1, wherein the at least one member formed of nonconductor and/or semiconductor provided between said intermediate transparent conductive film and said contact line is a composite member of a site that is formed of a material having a same composition with a portion of the photoelectric conversion layer provided on a light incident side of the intermediate transparent conductive film and a site that is formed of a material having a same composition with a portion of the photoelectric conversion layer provided on a back surface side of the intermediate transparent conductive film.

5. The solar battery cell according to claim 1, wherein a semiconductor film constituting the photoelectric conversion layer is one of a crystalline silicon based semiconductor film and a non-crystalline silicon based semiconductor film.

6. The solar battery cell according to claim 1, wherein the photoelectric conversion layers formed of the stacked semiconductor films are of a p-i-n type three-layer structure of a-Si:H and/or a p-i-n type three-layer structure of $\mu$c-Si:H.

7. The solar battery cell according to claim 1, wherein the intermediate transparent conductive film is formed of a transparent conductive film employing a material including one of zinc oxide, tin oxide and ITO.

* * * * *